(12) United States Patent
Miura

(10) Patent No.: US 6,943,594 B2
(45) Date of Patent: Sep. 13, 2005

(54) DRIVER INCLUDING VOLTAGE-FOLLOWER-TYPE OPERATIONAL AMPLIFIER WITH HIGH DRIVING POWER AND DISPLAY APPARATUS USING THE SAME

(75) Inventor: Makoto Miura, Yamagata (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/824,596

(22) Filed: Apr. 15, 2004

(65) Prior Publication Data

US 2004/0207434 A1 Oct. 21, 2004

(30) Foreign Application Priority Data

Apr. 17, 2003 (JP) .......... 2003-112810

(51) Int. Cl.[7] .................. H03B 1/00
(52) U.S. Cl. ..................... 327/108
(58) Field of Search .......... 326/82–83, 85–87; 327/18–26, 58, 62, 65–66, 89–90, 103, 108; 345/80, 87, 100

(56) References Cited

U.S. PATENT DOCUMENTS 6,157,228 A * 12/2000 Yokoyama et al. .......... 327/144
6,392,354 B1 * 5/2002 Matsueda ................ 315/169.1
6,674,422 B2 * 1/2004 Ozawa ........................ 345/98
6,753,731 B2 * 6/2004 Maki .......................... 330/255

FOREIGN PATENT DOCUMENTS

JP          11-88076          3/1999

* cited by examiner

Primary Examiner—My-Trang Nu Ton
(74) Attorney, Agent, or Firm—McGinn & Gibb, PLLC

(57) ABSTRACT

In a driver, a voltage-follower-type operational amplifier receives current input data to generate an output signal. A transient state detecting circuit detects a transient state in the current input data to generate a first pulse signal when the current input data is increased and generate a second pulse signal when the current input data is decreased. A switch circuit substantially increases corresponding load currents flowing through the voltage-follower-type operational amplifier in accordance with the first and second pulse signals.

22 Claims, 14 Drawing Sheets

DRIVER INCLUDING VOLTAGE-FOLLOWER-TYPE OPERATIONAL AMPLIFIER WITH HIGH DRIVING POWER AND DISPLAY APPARATUS USING THE SAME

BACKGROUND OF THE INVENTION

1. Field of the Invention

The present invention relates to a driver including a voltage-follower-type operational amplifier used in driving data lines (signal lines) of a display apparatus such as a liquid crystal display (LCD) apparatus.

2. Description of the Related Art

In a display apparatus such as an active matrix type LCD apparatus where a plurality of pixels each formed by one thin film transistor (TFT) and one pixel capacitor are provided at intersections between a plurality of data lines (or signal lines) and a plurality of gate lines (or scan lines), drivers are provided to drive the data lines.

A prior art driver is constructed by a voltage-follower-type operational amplifier which is divided into an input stage formed by two parallel differential amplifiers for realizing an input wide range and an output stage formed by a single-end push-pull circuit for realizing an output wide range. Also, in order to rapidly converge a transient state to an equilibrium state, the driving ability is enhanced by increasing bias currents flowing through the differential amplifiers of the input stage using the feedback control of the output stage (see: JP-A-11-088076). This will be explained later in detail.

In the above-described prior art driver, however, when a transient state is rapidly converged to an equilibrium state, the driving ability is enhanced by increasing the bias currents, which would increase the power consumption.

SUMMARY OF THE INVENTION

It is an object of the present invention to provide a driver capable of enhancing the driving ability without increasing the power consumption.

Another object is to provide a data line driver circuit used in a display apparatus including such a driver.

According to the present invention, in a driver, a voltage-follower-type operational amplifier receives current input data to generate an output signal. A transient state detecting circuit detects a transient state in the current input data to generate a first pulse signal when the current input data is increased and generate a second pulse signal when the current input data is decreased. A switch circuit substantially increases corresponding load currents flowing through the voltage-follower-type operational amplifier in accordance with the first and second pulse signals.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENT

Before the description of the preferred embodiment, a prior art LCD apparatus will be explained with reference to FIGS. 1 and 2.

Figure 1:
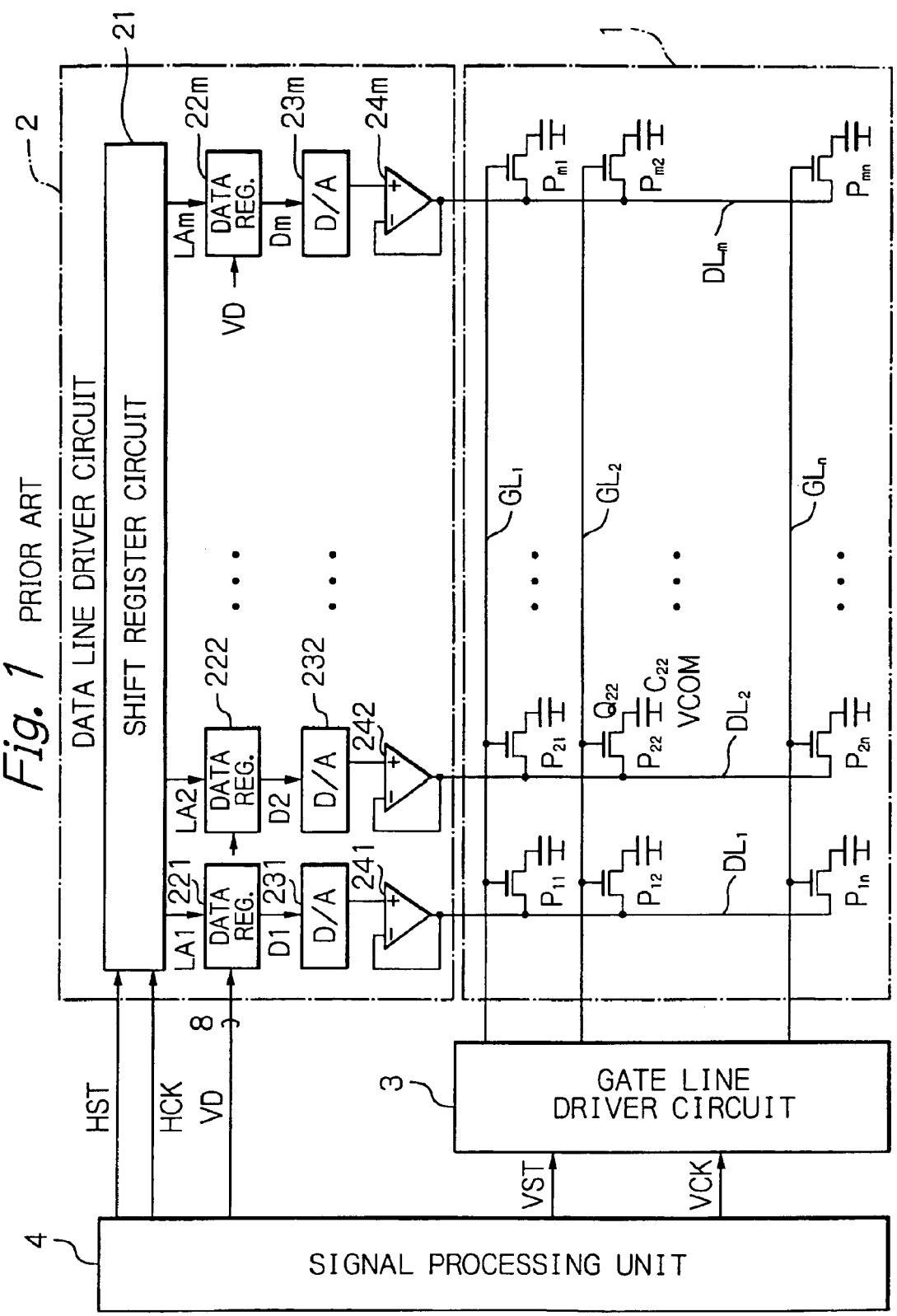
FIG. 1 is a circuit diagram illustrating a prior art LCD apparatus.

In FIG. 1, which illustrates a prior art LCD apparatus, reference numeral 1 designates a panel having m×n dots where m is 640 and n is 480, for example. That is, the panel 1 includes m data lines (or signal lines) $DL_1, DL_2, \ldots, DL_m$ driven by a data line driver circuit 2, n gate lines (or scan lines) $GL_1, GL_2, \ldots, GL_n$ driven by a gate line driver circuit 3, and m×n pixels $P_{ij}$ (i=1, 2, ..., m; j=1, 2, ..., n) each located at one intersection between the data lines $DL_1, DL_2, \ldots, DL_m$ and the gate lines $GL_1, GL_2, \ldots, GL_n$. Each of the pixels $P_{ij}$ is constructed by one thin film transistor (TFT) $Q_{ij}$ such as $Q_{22}$ and one pixel capacitor $C_{ij}$ such as $C_{22}$ including liquid crystal connected between the TFT $Q_{ij}$ and a common electrode to which a common voltage VCOM is applied.

The data line driver circuit 2 is constructed by a shift register circuit 21 for shifting a horizontal start pulse signal (HST) in synchronization with a horizontal clock signal HCK to sequentially generate latch signals LA1, LA2, ..., LAm, data register circuits 221, 222, ..., 22m for latching an 8-bit gradation video signal VD in accordance with the latch signals LA1, LA2, ..., LAm, respectively, to generate digital video data D1, D2, ..., Dm, digital/analog (D/A) converters 231, 232, ..., 23m for performing D/A conversions upon the digital video signals D1, D2, ..., Dm, respectively, and drivers 241, 242, ..., 24m for amplifying analog output voltages of the D/A converters 231, 232, ..., 23m, respectively, to supply them to the corresponding data lines $DL_1, DL_2, \ldots, DL_m$.

Thus, analog video signals corresponding the digital video data D1, D2, ..., Dm are supplied to the data lines $DL_1, DL_2, \ldots, DL_m$, respectively.

The gate line driver circuit 3 is constructed by a shift register circuit for shifting a vertical start pulse signal VST in synchronization with a vertical clock signal VCK to sequentially generate gate line signals on the gate lines $GL_1, GL_2, \ldots, GL_n$.

A signal processing unit 4 is provided to supply the signals HST, HCK, VD, VST, VCK and the like to the data line driver circuit 2 and the gate line driver circuit 3.

Figure 2:
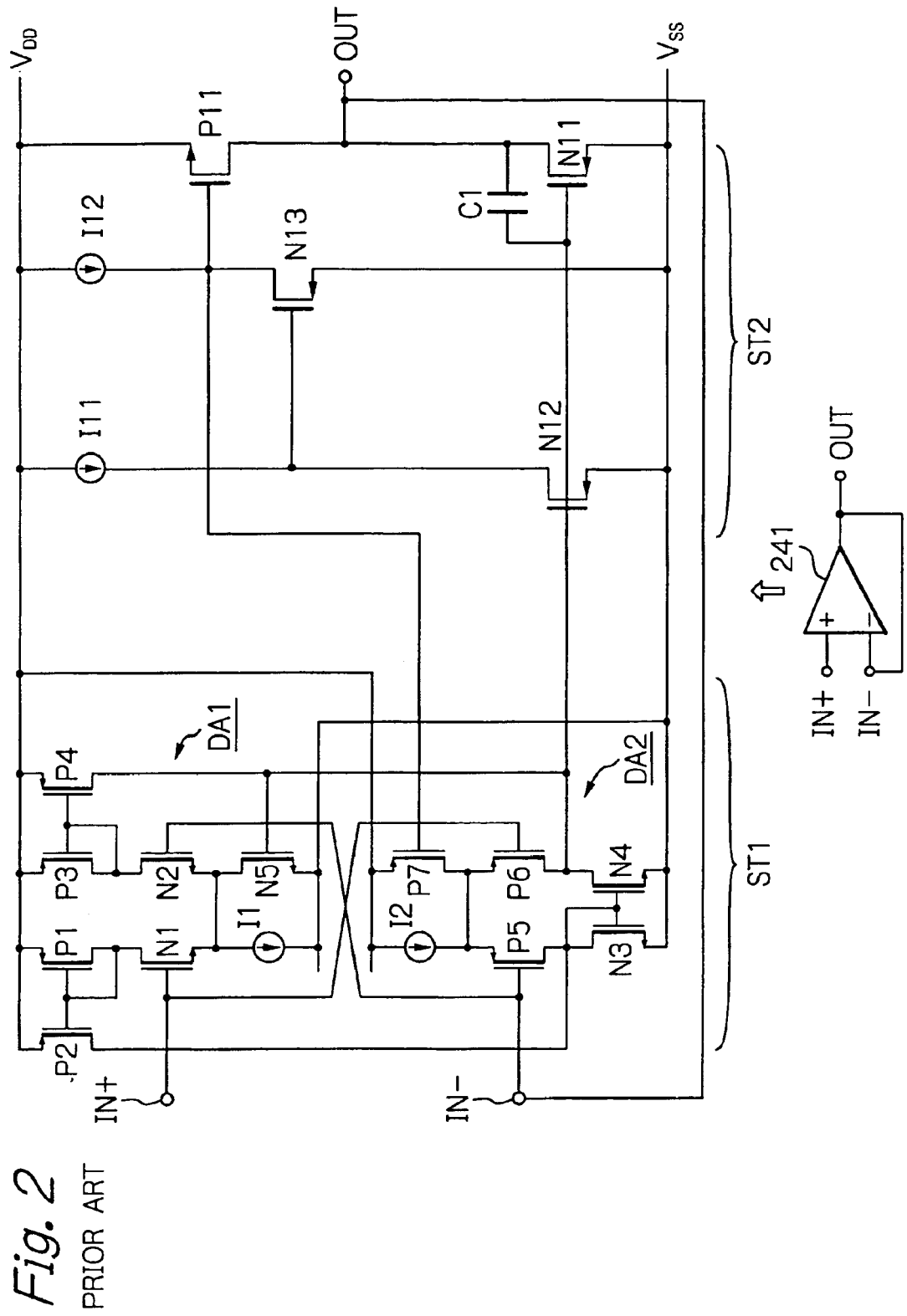
FIG. 2 is a detailed circuit diagram of the driver of FIG. 1.

Each of the drivers 241, 242, ..., 24m is constructed by a voltage-follower-type operational amplifier as illustrated in FIG. 2 (see: JP-A-11-088076).

In FIG. 2, the voltage-follower-type operational amplifier is divided into an input stage ST1 and an output stage ST2.

The input stage ST1 is constructed by two differential amplifiers DA1 and DA2 connected in parallel between a high potential side power supply terminal $V_{DD}$ and a low potential side power supply terminal $V_{SS}$.

The differential amplifier DA1 is constructed by a differential pair formed by N-channel MOS transistors N1 and N2 having gates connected to input terminals IN+ and IN−, respectively, and a common source connected to a current source I1, a current mirror circuit formed by P-channel MOS transistors P1 and P2, and a current mirror circuit formed by P-channel MOS transistors P3 and P4.

In the current mirror circuit (P1, P2), the drain of the P-channel MOS transistor P1 serves as an input and is connected to the drain of the N-channel MOS transistor N1, and the drain of the P-channel MOS transistor P2 serves as an output.

In the current mirror circuit (P3, P4), the drain of the P-channel MOS transistor P3 serves as an input and is connected to the drain of the N-channel MOS transistor N2, and the drain of the P-channel MOS transistor P4 serves as an output.

Also, the current source I1 is connected to the low potential side power supply terminal $V_{SS}$, while the sources of the P-channel MOS transistors P1, P2, P3 and P4 are connected to the high potential side power supply terminal $V_{DD}$. In this case, the P-channel MOS transistors P1 and P3 serve as active loads of the differential amplifier DA1.

On the other hand, the differential amplifier DA2 is constructed by a differential pair formed by P-channel MOS transistors P5 and P6 having gates connected to the input terminals IN− and IN+, respectively, and a common source connected to a current source I2, and a current mirror circuit formed by N-channel MOS transistors N3 and N4.

In the current mirror circuit (N3, N4), the drain of the N-channel MOS transistor N3 serves as an input and is connected to the drain of the P-channel MOS transistor P5, and the drain of the N-channel MOS transistor N4 serves as an output.

Also, the current source I2 is connected to the high potential side power supply terminal $V_{DD}$, while the sources of the N-channel MOS transistors N3 and N4 are connected to the low potential side power supply terminal $V_{SS}$. In this case, the N-channel MOS transistors N3 and N4 serve as active loads of the differential amplifier DA2.

The output of the current mirror circuit (P1, P2), i.e., the drain of the P-channel MOS transistor P2 is connected to the input of the current mirror circuit (N3, N4), i.e., the drain of the N-channel MOS transistor N3. Also, the output of the current mirror circuit (P3, P4), i.e., the drain of the P-channel MOS transistor P4 is connected to the output of the current mirror circuit (N3, N4), i.e., the drain of the N-channel MOS transistor N4.

Further, an N-channel MOS transistor N5 is connected in parallel to the current source I1 to substantially increase a bias current flowing through the differential amplifier DA1, and a P-channel MOS transistor P7 is connected in parallel to the current source I2, to substantially increase a bias current flowing through the differential amplifier DA2. That is, in an equilibrium state where the voltage at the input terminal IN+ is close to the voltage at the input terminal IN−, the bias current flowing through the differential amplifier DA1 is determined by only the current source I1, and the bias current flowing through the differential amplifier DA2 is determined by only the current source I2.

On the other hand, in a transient state where the voltage at the input terminal IN+ is higher or lower than the voltage at the input terminal IN−, in order to rapidly converge this transient state to an equilibrium state, the N-channel MOS transistor N5 or the P-channel MOS transistor P7 is turned ON by the feedback of internal signals of the output stage ST2 to substantially increase the corresponding bias current, thus increasing the driving ability. This will be explained in detail later.

The output stage ST2 is constructed by a single-end push-pull circuit formed by a P-channel MOS transistor P11 and an N-channel MOS transistor N11 connected in series between the high potential side power supply terminal $V_{DD}$ and the low potential side power supply terminal $V_{SS}$, and a phase compensation capacitor C1 connected between the drain and gate of the N-channel MOS transistor N11. The output voltage of the input stage ST1, i.e., the voltage at the drains of the P-channel MOS transistor P4 and the N-channel MOS transistor N4 is supplied to the gate of the N-channel MOS transistor N11, while the output voltage of the input stage ST1 is supplied via a level shift circuit formed by N-channel MOS transistors N12 and N13 and current sources I11 and I12 to the gate of the P-channel MOS transistor P11.

The gate voltage of the N-channel MOS transistor N11 is fed back to the N-channel MOS transistor N5 of the input stage ST1, and the gate voltage of the P-channel MOS transistor P11 is fed back to the P-channel MOS transistor P7 of the input stage ST1.

If the voltage at the input terminal IN+ is lower than the voltage at the output terminal OUT (i.e., the input terminal IN−), the drain voltage of the P-channel MOS transistor P11 (i.e., the gate voltage of the N-channel MOS transistor N11) is increased, so that the N-channel MOS transistor N5 is turned ON, thus substantially increasing the bias current flowing through the differential amplifier DA1. Thus, the driving ability of the differential amplifier DA1 is enhanced.

On the other hand, if the voltage at the input terminal IN+ is higher than the voltage at the output terminal OUT (i.e., the input terminal IN−), the drain voltage of the N-channel MOS transistor N2 is increased, so that the drain voltage of the P-channel MOS transistor P4 (i.e., the input voltage of the level shift circuit (N12, N13, I11, I12) is decreased. Therefore, the output voltage of the level shift circuit (N12, N13, I11, I12) (i.e., the gate voltage of the P-channel MOS transistor P11) is decreased, so that the P-channel MOS transistor P7 is turned ON, thus substantially increasing the bias current flowing through the differential amplifier DA2. Thus, the driving ability of the differential amplifier DA2 is enhanced.

In the driver of FIG. 2, however, in a transient state, since the driving ability is enhanced by increasing bias currents, not only are the load currents flowing through the current mirror circuits (P1, P2), (P3, P4) and (N3, N4) increased, but also the currents flowing through the differential pairs (N1, N2) and (P5, P6) are also increased, so that the power consumption is enormously large.

Figure 3:
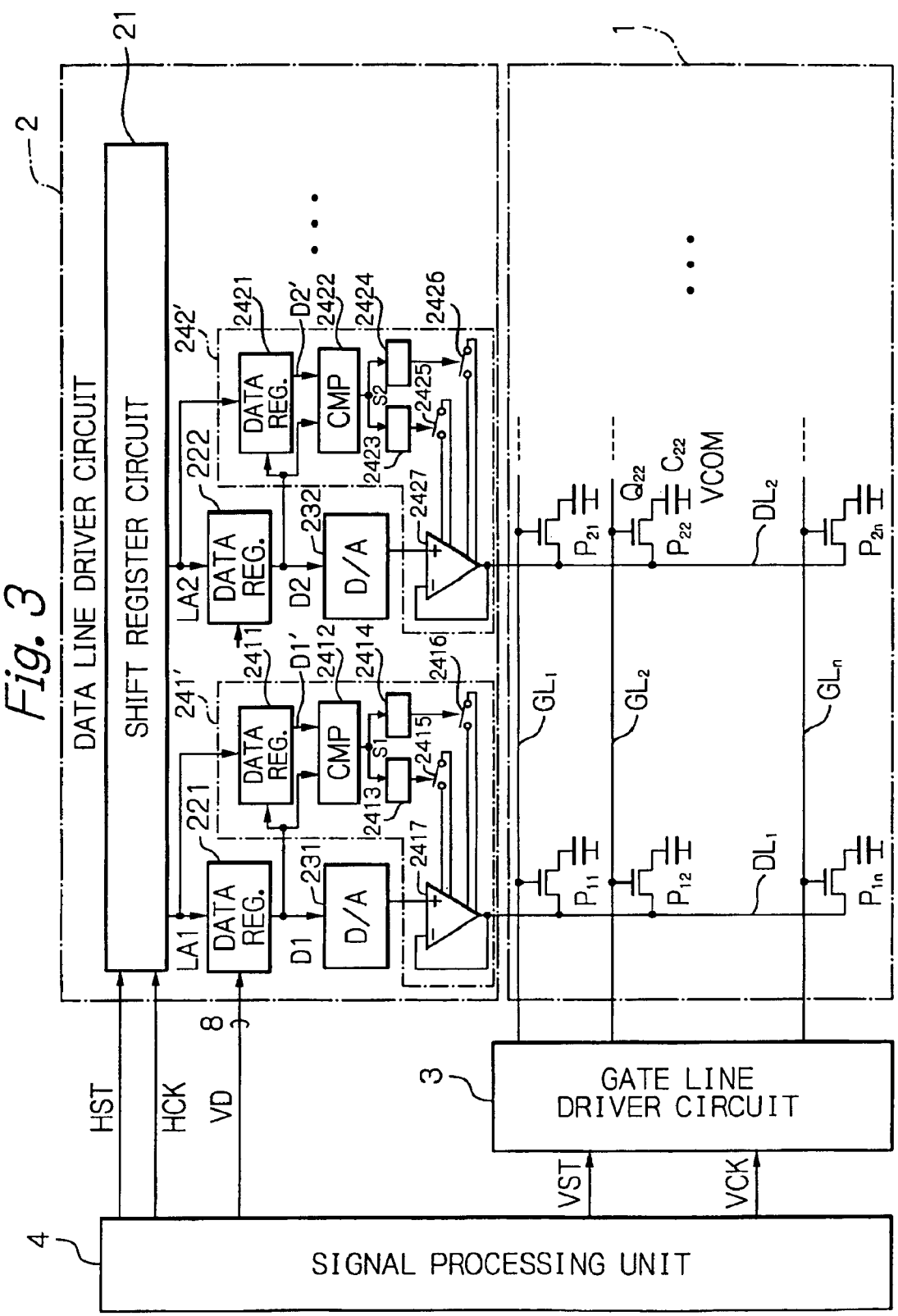
FIG. 3 is a circuit diagram illustrating an embodiment of the LCD apparatus according to the present invention.

In FIG. 3, which illustrates an embodiment of the LCD apparatus according to the present invention, the drivers 241, 242, . . . of FIG. 1 are replaced by drivers 241', 242', . . . , respectively.

The driver 241' (242', . . . ) is constructed by a data register circuit 2411 (2421, . . . ) for latching the digital video data D1 (D2, . . . ) of the data register circuit 221 (222, . . . ) in accordance with the latch signal LA1 (LA2, . . . ) to generate digital video data D1' (D2', . . . ). That is, the digital video data D1' (D2', . . . ) is a previous data of the digital video data D1 (D2, . . . ) before one horizontal period. The driver 241' (242', . . . ) is further constructed by a digital comparator 2412 (2422, ...) for comparing the digital video data D1 (D2, ...) with the digital video data D1' (D2', ...), two one-shots (monostable multivibrators) 2413 and 2414 (2423 and 2424,), switches 2415 and 2416 (2425 and 2426, ...) and a voltage-follower-type operational amplifier 2417 (2427, ...).

When the digital video data such as D1 is larger than the digital video data such as D1', the output signal S1 of the digital comparator such as 2412 is high. On the other hand, when the digital video data such as D1 is not larger than the digital video data such as D1', the output signal S1 of the digital comparator such as 2412 is low.

The one-shot such as 2413 is triggered by a rising edge of the output signal S1 of the digital comparator 2412, while the one-shot such as 2414 is triggered by a falling edge of the output signal S1 of the digital comparator 2412. Therefore, when the digital video data D1 is increased so that D1>D1', the output signal S1 of the digital comparator 2412 is switched from low to high. As a result, the one-shot 2413 generates a pulse signal having a duration τ to turn ON the switch 2415. On the other hand, when the digital video data D1 is decreased so that D1<D1', the output signal S1 of the digital comparator 2412 is switched from high to low. As a result, the one-shot 2414 generates a pulse signal having a duration τ to turn ON the switch 2416.

If each of the switches 2415 and 2416 is formed by a P-channel MOS transistor or a PNP-type bipolar transistor, the pulse signals generated from the one-shots 2413 and 2414 are low. On the other hand, if each of the switches 2415 and 2416 is formed by an N-channel MOS transistor or an NPN-type bipolar transistor, the pulse signals generated from the one-shots 2413 and 2414 are high.

Figure 4:
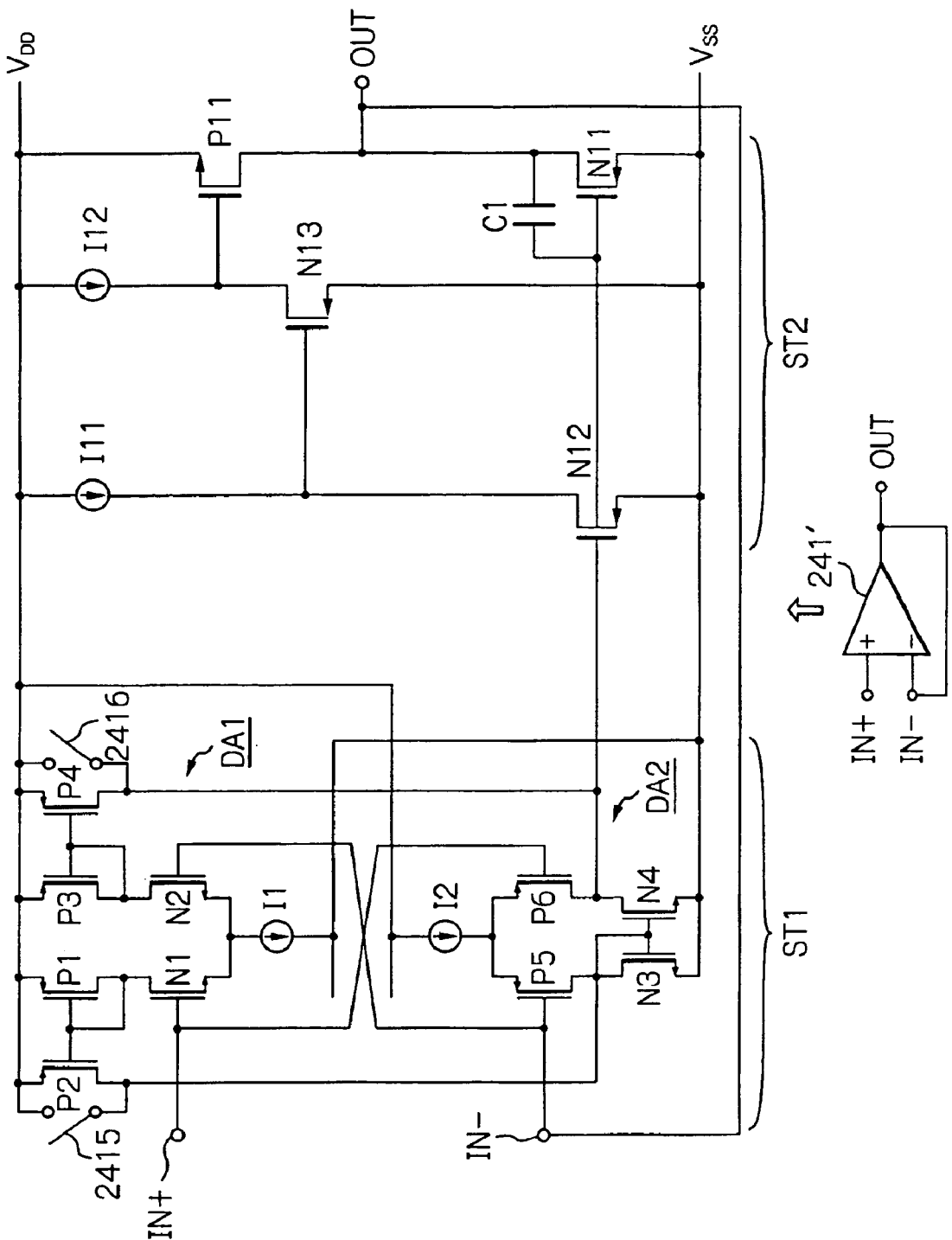
FIG. 4 is a detailed circuit diagram illustrating a first example of the switches and the voltage-follower-type operational amplifier of FIG. 3.

In FIG. 4, which is a detailed circuit diagram of a first example of the switches 2415 and 2416 and the voltage-follower-type operational amplifier 2417 of FIG. 3, the N-channel MOS transistor N5 and the P-channel MOS transistor P7 of FIG. 2 are deleted. Instead of this, the switch 2415 of FIG. 3 is connected between the high potential side power supply line $V_{DD}$ and the input of the current mirror circuit (N3, N4), and the switch 2416 of FIG. 3 is connected between the high potential side power supply line $V_{DD}$ and the output of the current mirror circuit (N3, N4).

Figure 5:
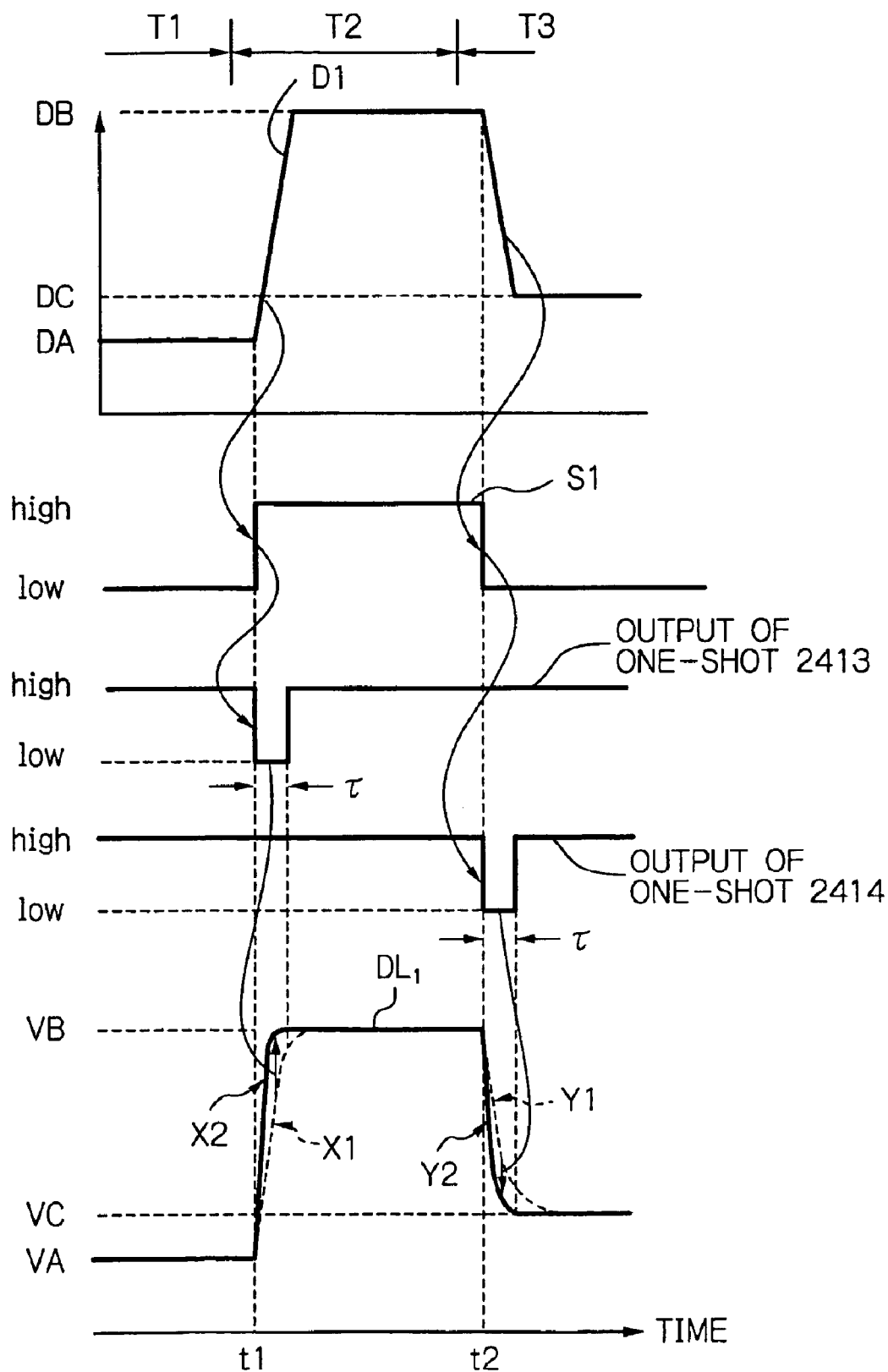
FIG. 5 is a timing diagram for explaining the operation of the LCD apparatus of FIG. 3.

The operation of the LCD apparatus of FIGS. 3 and 4 is explained next with reference to FIG. 5. In a first horizontal period T1, assume that the digital video data D1 stored in the data register circuit 221 is in an equilibrium state, i.e., D1=D1'=DA, and accordingly, the voltage at the data line $DL_1$ is also in an equilibrium state, i.e., $DL_1$=VA.

First, at time t1 which belongs to a second horizontal period, the digital video data D1 stored in the data register circuit 221 is increased from DA to DB, so D1=DB and D1'=DA. Therefore, the control enters an equilibrium state where the differential pair (N1, N2) and the differential pair (P5, P6) are imbalanced. As a result, the voltage at the data line $DL_1$ rises as indicated by a dotted line X1. Additionally, in this case, when the output signal S1 of the digital comparator 2412 is switched from low to high, the one-shot 2413 generates a low pulse signal to turn ON the switch 2415. Here, since the switch 2415 is a P-channel MOS transistor or an NPN-type bipolar, this pulse signal is low. However, if the switch 2415 is an N-channel MOS transistor or a PNP-type bipolar transistor, this pulse signal is high. As a result, a current is supplied from the high potential side power line $V_{DD}$ via the switch 2415 to the input of the current mirror circuit (N3, N4), so that load currents flowing through the current mirror circuit (N3, N4) are increased. As a result, the output voltage of the current mirror circuit (N3, N4), i.e., the drain voltage of the N-channel MOS transistor N4 is pulled down for the time period τ. Therefore, the gate voltage of the N-channel MOS transistor N6 is pulled down, and also, the gate voltage of the P-channel MOS transistor P11 is pulled down, so that the voltage at the data line $DL_1$ is eventually increased as indicated by a solid line X2, thus rapidly converging to a voltage VB corresponding to the digital video data DB.

Thus, the driving ability of the differential amplifier DA1 is enhanced by substantially increasing the load currents flowing through the current mirror circuit (N3, N4) using the switch 2415. In this case, the bias current flowing through the current source I2 is not increased, so that the currents flowing through the differential pair (P5, P6) are not increased, which would reduce the power consumption.

Next, at time t2 which belongs to a third horizontal period, the digital video data D1 stored in the data register circuit 221 is decreased from DB to DC, so D1=DC and D1'=DB. Therefore, the control enters an equilibrium state where the differential pair (N1, N2) and the differential pair (P5, P6) are imbalanced. As a result, the voltage at the data line $DL_1$ falls as indicated by a dotted line Y1. Additionally, in this case, when the output signal S1 of the digital comparator 2412 is switched from high to low, the one-shot 2414 generates a low pulse signal to turn ON the switch 2416. Here, since the switch 2416 is a P-channel MOS transistor or an NPN-type bipolar transistor, this pulse signal is low. However, if the switch 2416 is an N-channel MOS transistor or a PNP-type bipolar transistor, this pulse signal is high. As a result, a current is supplied from the high potential side power supply line $V_{DD}$ via the switch 2416 to the output of the current mirror circuit (N3, N4), so that a load current flowing through the current mirror circuit (N3, N4) is substantially increased. In this case, however, since the gate voltage of the N-channel MOS transistor N4 is not increased to make the N-channel MOS transistor N4 in a saturated state, the drain voltage of the N-channel MOS transistor N4 is pulled up for the time period τ. Therefore, the gate voltage of the N-channel MOS transistor N11 is pulled up, and also, the gate voltage of the P-channel MOS transistor M8 is pulled up, so that the voltage at the data line $DL_1$ is eventually decreased as indicated by a solid line Y2, thus rapidly converging to a voltage VC corresponding to the digital video data DC.

Thus, the driving ability of the differential amplifier DA1 is enhanced by substantially increasing the load current flowing through the N-channel MOS transistor N4 using the switch 2416. Even in this case, the bias current flowing through the current source I2 is not increased, so that the currents flowing through the differential pair (P5, P6) are not increased, which would reduce the power consumption.

Figure 6:
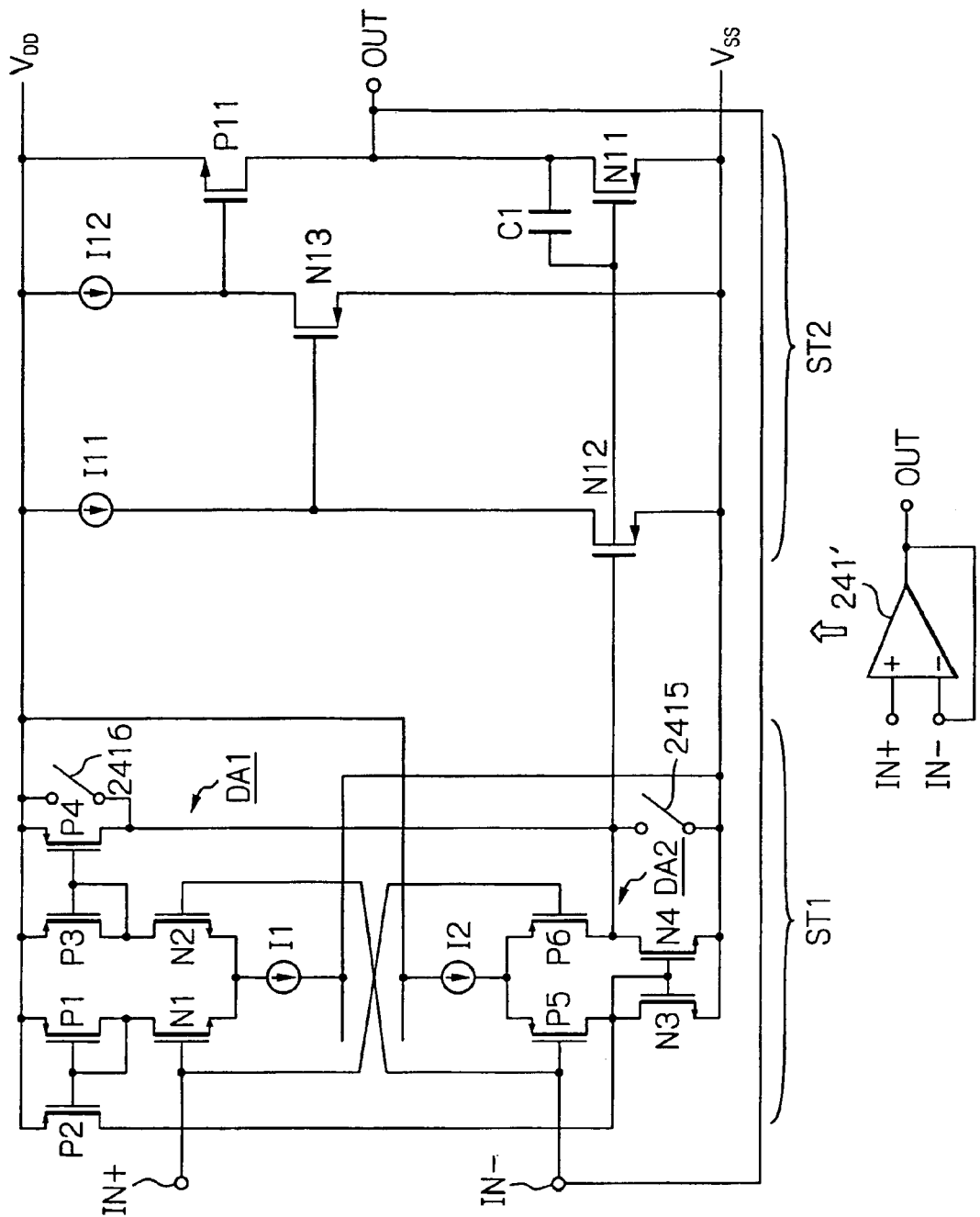
FIGS. 6, 7 and 8 are detailed circuit diagrams of second, third and fourth examples of the driver of FIG. 3.

In FIG. 6, which is a detailed circuit diagram of a second example of the switches 2415 and 2416 and the voltage-follower-type operational amplifier 2417 of FIG. 3, the switch 2415 of FIG. 3 is connected between the low potential side power supply line $V_{SS}$ and the output of the current mirror circuit (N3, N4), and the switch 2416 of FIG. 3 is connected between the high potential side power supply line $V_{DD}$ and the output of the current mirror circuit (N3, N4) of FIG. 4.

The operation of the LCD apparatus of FIGS. 3 and 6 is explained next with reference to FIG. 5. In a first horizontal period T1, assume that the digital video data D1 stored in the data register circuit 221 is in an equilibrium state, i.e., D1=D1'=DA, and accordingly, the voltage at the data line $DL_1$ is also in an equilibrium state, i.e., $DL_1$=VA.

First, at time t1 which belongs to second horizontal period, the digital video data D1 stored in the data register circuit 221 is increased from DA to DB, so D1=DB and D1'=DA. Therefore, the control enters an equilibrium state where the differential pair (N1, N2) and the differential pair (P5, P6) are imbalanced. As a result, the voltage at the data line $DL_1$ rises as indicated by a dotted line X1. Additionally, in this case, when the output signal S1 of the digital comparator 2412 is switched from low to high, the one-shot 2413 generates a pulse signal to turn ON the switch 2415. As a result, a current is supplied from the output of the current mirror circuit (N3, N4) via the switch 2415 the low potential side power supply line $V_{SS}$, so that a load current flowing through the N-channel MOS transistor N4 is substantially increased. As a result, the output voltage of the current mirror circuit (N3, N4), i.e., the drain voltage of the N-channel MOS transistor N4 is pulled down for the time period τ. Therefore, the gate voltage of the N-channel MOS transistor N11 is pulled down, and also, the gate voltage of the P-channel MOS transistor P11 is pulled down, so that the voltage at the data line $DL_1$ is eventually increased as indicated by a solid line X2, thus rapidly converging to a voltage VB corresponding to the digital video data DB.

Thus, the driving ability of the differential amplifier DA1 is enhanced by substantially increasing the load current flowing through the current mirror circuit (N3, N4) using the switch 2415. In this case, the bias current flowing through the current source I2 is not increased, so that the currents flowing through the differential pair (P5, P6) are not increased, which would reduce the power consumption.

Next, at time t2 which belongs to third horizontal period, the digital video data D1 stored in the data register circuit 221 is decreased from DB to DC, so D1=DC and D1'=DB. Therefore, the control enters an equilibrium state where the differential pair (N1, N2) and the differential pair (P5, P6) are imbalanced. As a result, the voltage at the data line $DL_1$ falls as indicated by a dotted line Y1. Additionally, in this case, when the output signal S1 of the digital comparator 2412 is switched from high to low, the one-shot 2414 generates a pulse signal to turn ON the switch 2416. As a result, a current is supplied from the high potential side power supply line $V_{DD}$ via the switch 2416 to the output of the current mirror circuit (N3, N4), so that a load current flowing through the current mirror circuit (N3, N4) is substantially increased. In this case, however, since the gate voltage of the N-channel MOS transistor N4 is not increased to make the N-channel MOS transistor N4 in a saturated state, the drain voltage of the N-channel MOS transistor N4 is pulled up for the time period τ. Therefore, the gate voltage of the N-channel MOS transistor N11 is pulled up, and also, the gate voltage of the P-channel MOS transistor M8 is pulled up, so that the voltage at the data line $DL_1$ is eventually decreased as indicated by a solid line Y2, thus rapidly converging to a voltage VC corresponding to the digital video data DC.

Thus, the driving ability of the differential amplifier DA1 is enhanced by substantially increasing the load current flowing through the N-channel MOS transistor N4 using the switch 2416. Even in this case, the bias current flowing through the current source I2 is not increased, so that the currents flowing through the differential pair (P5, P6) are not increased, which would reduce the power consumption.

Figure 7:
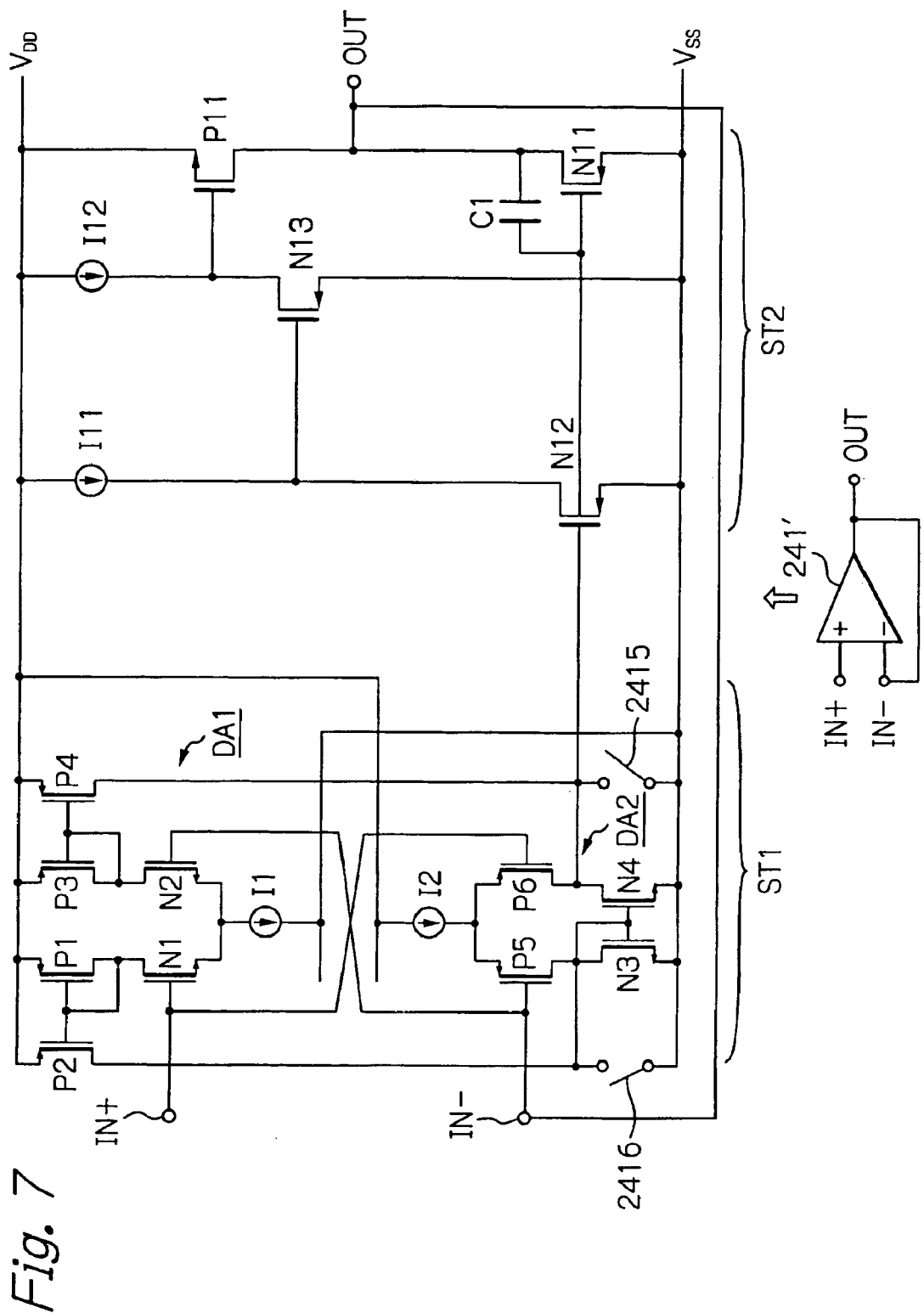

In FIG. 7, which is a detailed circuit diagram of a third example of the switches 2415 and 2416 and the voltage-follower-type operational amplifier 2417 of FIG. 3, the switch 2415 of FIG. 3 is connected between the low potential side power supply line $V_{SS}$ and the output of the current mirror circuit (N3, N4) of FIG. 4, and the switch 2416 of FIG. 3 is connected between the low potential side power supply line $V_{SS}$ and the input of the current mirror circuit (N3, N4) of FIG. 4.

The operation of the LCD apparatus of FIGS. 3 and 7 is explained next with reference to FIG. 5. In a first horizontal period T1, assume that the digital video data D1 stored in the data register circuit 221 is in an equilibrium state, i.e., D1=D1'=DA, and accordingly, the voltage at the data line $DL_1$ is also in an equilibrium state, i.e., $DL_1$=VA.

First, at time t1 which belongs to a second horizontal period, the digital video data D1 stored in the data register circuit 221 is increased from DA to DB, so D1=DB and D1'=DA. Therefore, the control enters an equilibrium state where the differential pair (N1, N2) and the differential pair (P5, P6) are imbalanced. As a result, the voltage at the data line $DL_1$ rises as indicated by a dotted line X1. Additionally, in this case, when the output signal S1 of the digital comparator 2412 is switched from low to high, the one-shot 2413 generates a pulse signal to turn ON the switch 2415. As a result, a current is supplied from the output of the current mirror circuit (N3, N4) via the switch 2415 to the low potential side power supply line $V_{SS}$, so that a load current flowing through the N-channel MOS transistor N4 is substantially increased. As a result, the output voltage of the current mirror circuit (N3, N4), i.e., the drain voltage of the N-channel MOS transistor N4 is pulled down for the time period τ. Therefore, the gate voltage of the N-channel MOS transistor N11 is pulled down, and also, the gate voltage of the P-channel MOS transistor P11 is pulled down, so that the voltage at the data line $DL_1$ is eventually increased as indicated by a solid line X2, thus rapidly converging to a voltage VB corresponding to the digital video data DB.

Thus, the driving ability of the differential amplifier DA1 is enhanced by substantially increasing the load current flowing through the current mirror circuit (N3, N4) using the switch 2415. In this case, the bias current flowing through the current source I2 is not increased, so that the currents flowing through the differential pair (P5, P6) are not increased, which would reduce the power consumption.

Next, at time t2 which belongs to third horizontal period, the digital video data D1 stored in the data register circuit 221 is decreased from DB to DC, so D1=DC and D1'=DB. Therefore, the control enters an equilibrium state where the differential pair (N1, N2) and the differential pair (P5, P6) are imbalanced. As a result, the voltage at the data line $DL_1$ falls as indicated by a dotted line Y1. Additionally, in this case, when the output signal S1 of the digital comparator 2412 is switched from high to low, the one-shot 2414 generates a pulse signal to turn ON the switch 2416. As a result, a current is supplied from the input of the current mirror circuit (N3, N4) to the low potential side power supply line $V_{SS}$ via the switch 2416, so that a load current flowing through the N-channel MOS transistor N4 is substantially increased. As a result, the drain voltage of the N-channel MOS transistor N4 is pulled up for the time period τ. Therefore, the gate voltage of the N-channel MOS transistor N11 is pulled up, and also, the gate voltage of the P-channel MOS transistor P11 is pulled up, so that the voltage at the data line $DL_1$ is eventually decreased as indicated by a solid line Y2, thus rapidly converging to a voltage VC corresponding to the digital video data DC.

Thus, the driving ability of the differential amplifier DA1 is enhanced by substantially increasing the load current flowing through the N-channel MOS transistor N4 using the switch 2416. Even in this case, the bias current flowing through the current source I2 is not increased, so that the currents flowing through the differential pair (P5, P6) are not increased, which would reduce the power consumption.

Figure 8:
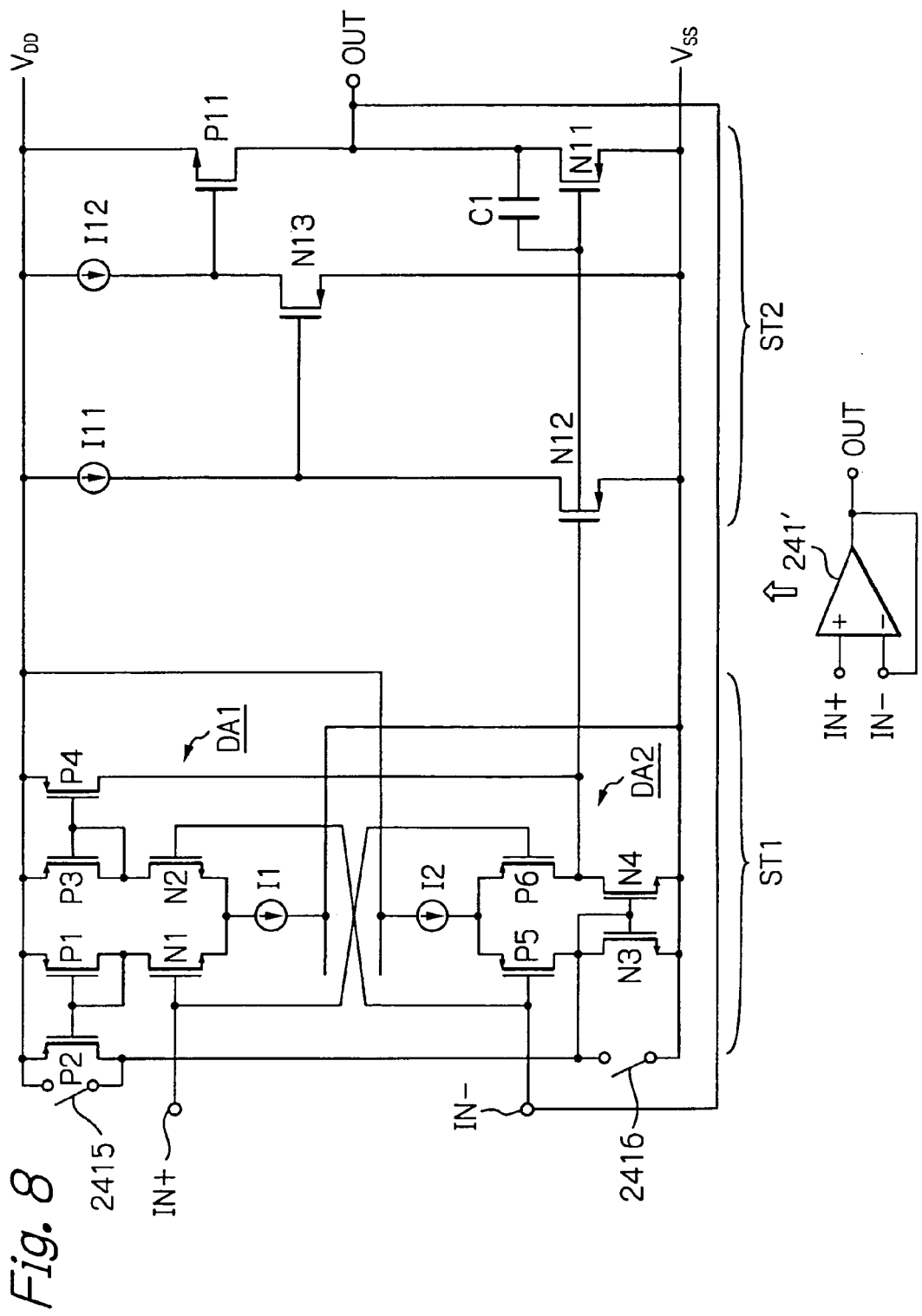

In FIG. 8, which is a detailed circuit diagram of a fourth example of the switches 2415 and 2416 and the voltage-follower-type operational amplifier 2417 of FIG. 3, the switch 2415 of FIG. 3 is connected between the high potential side power supply line $V_{DD}$ and the input of the current mirror circuit (N3, N4) of FIG. 4, and the switch 2416 of FIG. 3 is connected between the low potential side power supply line $V_{SS}$ and the input of the current mirror circuit (N3, N4) of FIG. 4.

The operation of the LCD apparatus of FIGS. 3 and 8 is explained next with reference to FIG. 5. In a first horizontal period T1, assume that the digital video data D1 stored in the data register circuit 221 is in an equilibrium state, i.e., D1=D1'=DA, and accordingly, the voltage at the data line $DL_1$ is also in an equilibrium state, i.e., $DL_1$=VA.

First, at time t1 which belongs to second horizontal period, the digital video data D1 stored in the data register circuit 221 is increased from DA to DB, so D1=DB and D1'=DA. Therefore, the control enters an equilibrium state where the differential pair (N1, N2) and the differential pair (P5, P6) are imbalanced. As a result, the voltage at the data line $DL_1$ rises as indicated by a dotted line X1. Additionally, in this case, when the output signal S1 of the digital comparator 2412 is switched from low to high, the one-shot 2413 generates a pulse signal to turn ON the switch 2415. As a result, a current is supplied from the high potential side power line $V_{DD}$ via the switch 2415 to the input of the current mirror circuit (N3, N4), so that load currents flowing through the current mirror circuit (N3, N4) are increased. As a result, the output voltage of the current mirror circuit (N3, N4), i.e., the drain voltage of the N-channel MOS transistor N4 is pulled down for the time period τ. Therefore, the gate voltage of the N-channel MOS transistor N11 is pulled down, and also, the gate voltage of the P-channel MOS transistor P11 is pulled down, so that the voltage at the data line $DL_1$ is eventually increased as indicated by a solid line X2, thus rapidly converging to a voltage VB corresponding to the digital video data DB.

Thus, the driving ability of the differential amplifier DA1 is enhanced by substantially increasing the load currents flowing through the current mirror circuit (N3, N4) using the switch 2415. In this case, the bias current flowing through the current source I2 is not increased, so that the currents flowing through the differential pair (P5, P6) are not increased, which would reduce the power consumption.

Next, at time t2 which belongs to third horizontal period, the digital video data D1 stored in the data register circuit 221 is decreased from DB to DC, so D1=DC and D1'=DB. Therefore, the control enters an equilibrium state where the differential pair (N1, N2) and the differential pair (P5, P6) are imbalanced. As a result, the voltage at the data line $DL_1$ falls as indicated by a dotted line Y1. Additionally, in this case, when the output signal S1 of the digital comparator 2412 is switched from high to low, the one-shot 2414 generates a pulse signal to turn ON the switch 2416. As a result, a current is supplied from the input of the current mirror circuit (N3, N4) via the switch 2416 to the low potential side power supply line $V_{DD}$, so that a load current flowing through the N-channel MOS transistor N4 is substantially increased. As a result, the drain voltage of the N-channel MOS transistor N4 is pulled down for the time period τ. Therefore, the gate voltage of the N-channel MOS transistor N11 is pulled up, and also, the gate voltage of the P-channel MOS transistor P11 is pulled up, so that the voltage at the data line $DL_1$ is eventually decreased as indicated by a solid line Y2, thus rapidly converging to a voltage VC corresponding to the digital video data DC.

Thus, the driving ability of the differential amplifier DA1 is enhanced by substantially increasing the load current flowing through the N-channel MOS transistor N4 using the switch 2416. Even in this case, the bias current flowing through the current source I2 is not increased, so that the currents flowing through the differential pair (P5, P6) are not increased, which would reduce the power consumption.

Figure 9:
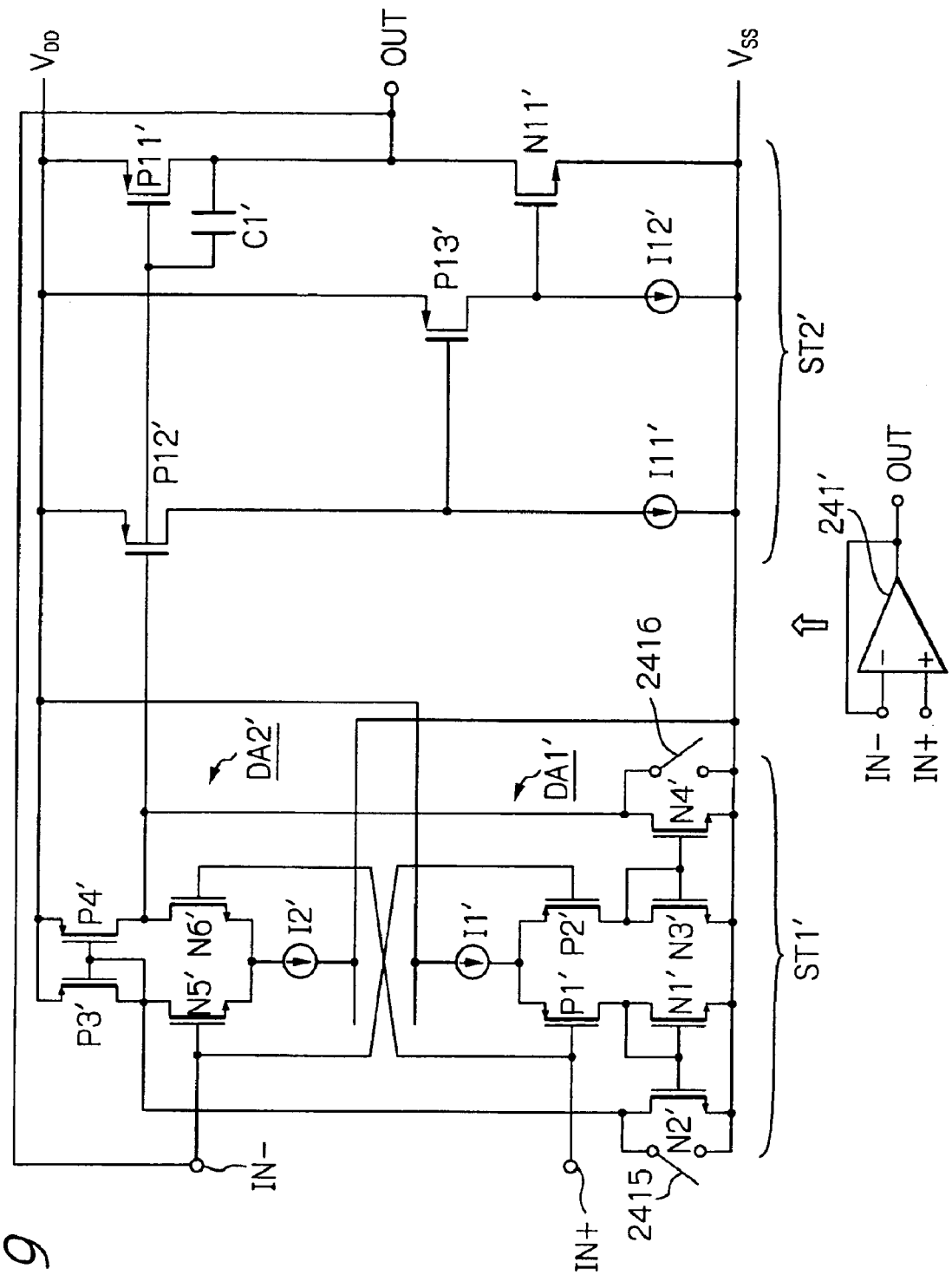
FIGS. 9, 10, 11 and 12 are circuit diagrams of modifications of the drivers of FIGS. 4, 6, 7 and 8, respectively.

In FIG. 9, which is a detailed circuit diagram of a fifth example of the switches 2415 and 2416 and the voltage-follower-type operational amplifier 2417 of FIG. 3, the voltage-follower-type operational amplifier 241' is divided into an input stage ST1' and an output stage ST2'.

The input stage ST1' is constructed by two differential amplifiers DA1' and DA2' connected in parallel between a high potential side power supply terminal $V_{DD}$ and a low potential side power supply terminal $V_{SS}$.

The differential amplifier DA1' is constructed by a differential pair formed by P-channel MOS transistors P1' and P2' having gates connected to the input terminals IN+ and IN−, respectively, and a common source connected to a current source I1', a current mirror circuit formed by N-channel MOS transistors N1' and N2', and a current mirror circuit formed by N-channel MOS transistors N3' and N4'.

In the current mirror circuit (N1', N2'), the drain of the N-channel MOS transistor N1' serves as an input and is connected to the drain of the P-channel MOS transistor P1', and the drain of the N-channel MOS transistor N2' serves as an output.

Also, the current source I1' is connected to the high potential side power supply terminal $V_{DD}$, while the sources of the N-channel MOS transistors N1', N2', N3' and N4' are connected to the low potential side power supply terminal $V_{SS}$. In this case, the N-channel MOS transistors N1' and N3' serve as active loads of the differential amplifier DA2'.

On the other hand, the differential amplifier DA2' is constructed by a differential pair formed by N-channel MOS transistors N5' and N6' having gates connected to input terminals IN− and IN+, respectively, and a common source connected to a current source I2', and a current mirror circuit formed by P-channel MOS transistors P3' and P4'.

In the current mirror circuit (P3', P4'), the drain of the P-channel MOS transistor P3' serves as an input and is connected to the drain of the N-channel MOS transistor N5', and the drain of the P-channel MOS transistor P4' serves as an output.

Also, the current source I2' is connected to the low potential side power supply terminal $V_{SS}$, while the sources of the P-channel MOS transistors P3' and P4' are connected to the high potential side power supply terminal $V_{DD}$. In this case, the P-channel MOS transistors P3' and P4' serve as active loads of the differential amplifier DA2'.

The input of the current mirror circuit (P3', P4'), i.e., the drain of the P-channel MOS transistor P3' is connected to the output of the current mirror circuit (N1', N2'), i.e., the drain of the N-channel MOS transistor N1'. Also, the output of the current mirror circuit (P3', P4'), i.e., the drain of the P-channel MOS transistor P4' is connected to the output of the current mirror circuit (N3', N4'), i.e., the drain of the N-channel MOS transistor N4'.

The output stage ST2' is constructed by a single-end push-pull circuit formed by a P-channel MOS transistor P11' and an N-channel MOS transistor N11' connected in series between the high potential side power supply terminal $V_{DD}$ and the low potential side power supply terminal $V_{SS}$, and a phase compensation capacitor C1' connected between the drain and gate of the P-channel MOS transistor P11'. The output voltage of the input stage ST1', i.e., the voltage at the drains of the P-channel MOS transistor P4' and the N-channel MOS transistor N4' is supplied to the gate of the P-channel MOS transistor P11', while the output voltage of the input stage ST1' is supplied via a level shift circuit formed by P-channel MOS transistors P12' and P13' and current sources I11' and I12' to the gate of the N-channel MOS transistor N11'.

Figure 10:
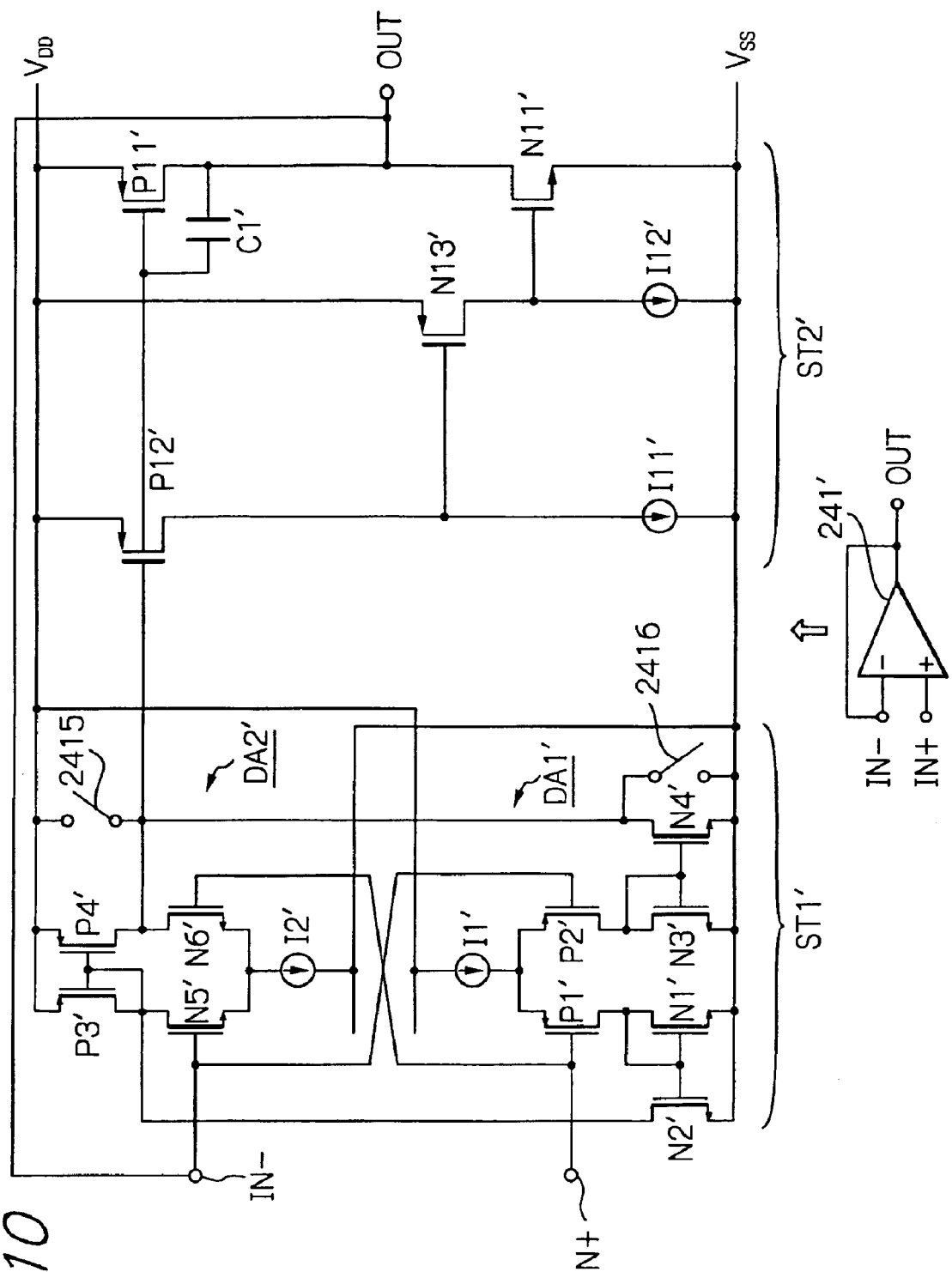
Figure 11:
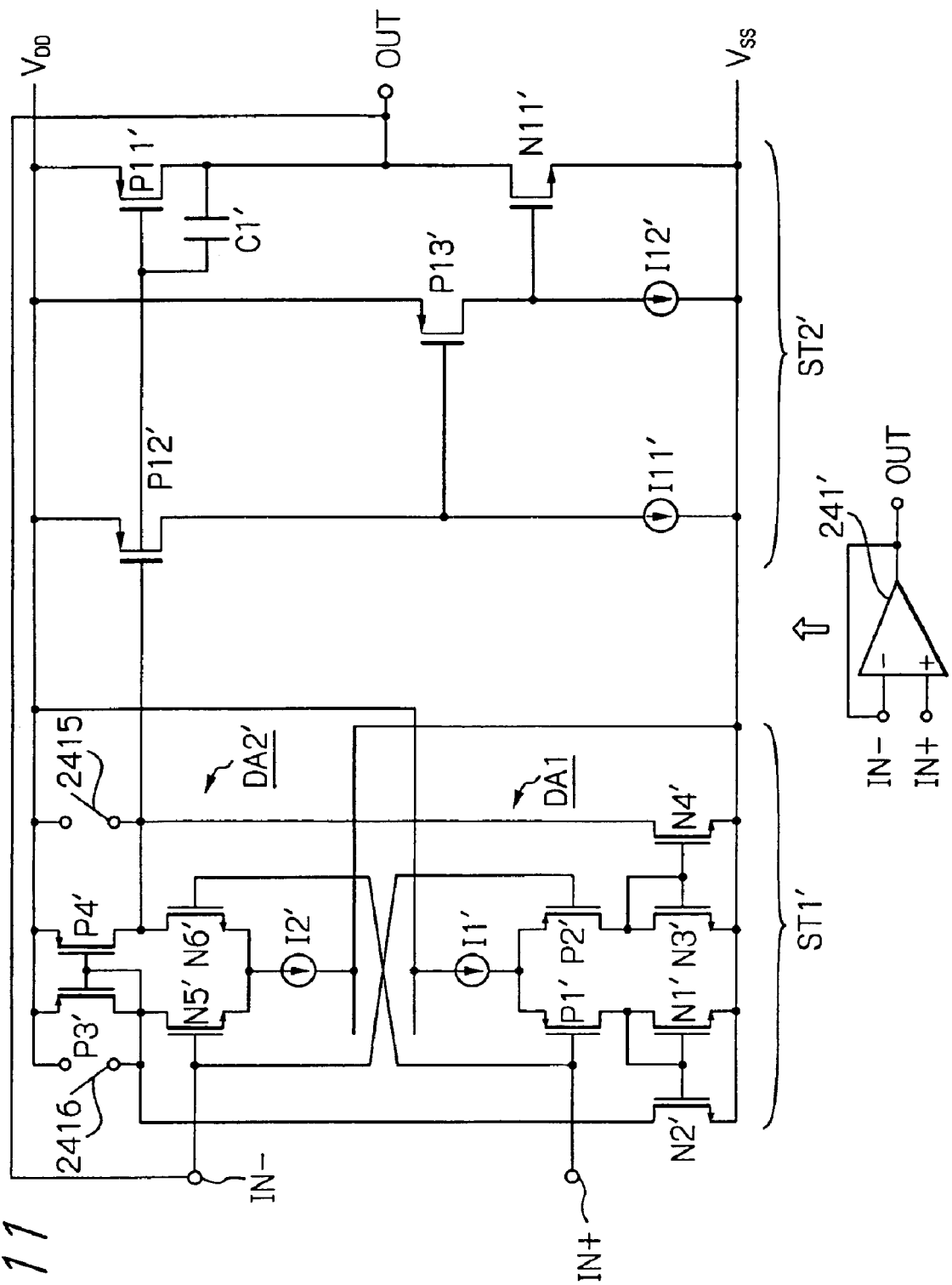
Figure 12:
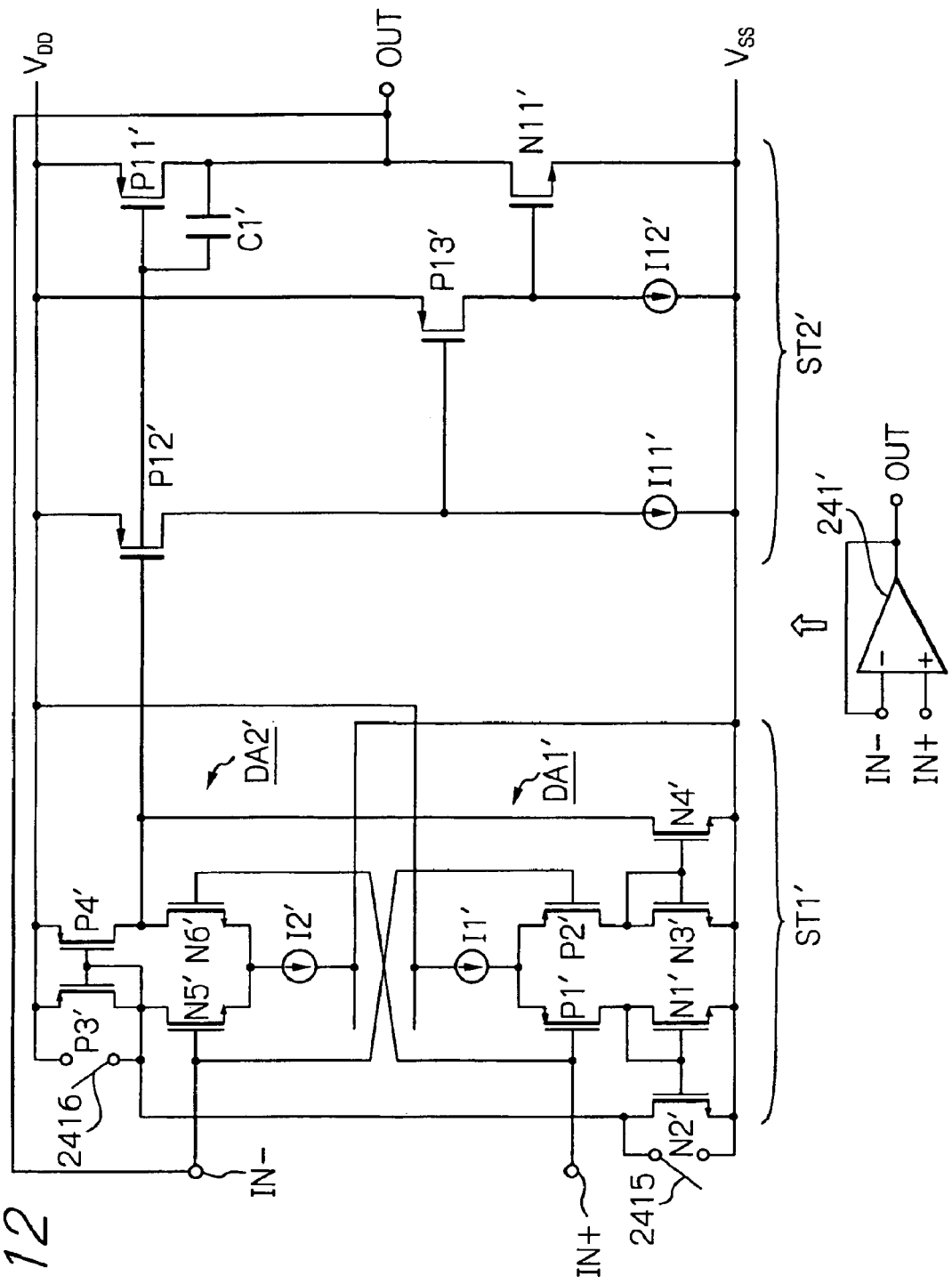

In FIGS. 10, 11 and 12, which are modifications of the circuits of FIGS. 6, 7, and 8, respectively, the input stage ST1 and the output stage ST2 of FIGS. 6, 7 and 8 are modified to an input stage ST1' and an output stage ST2' where the N-channel MOS transistors N1, N2, ... of FIGS. 6, 7 and 8 are replaced by P-channel MOS transistors P1', P2', ..., respectively, and the P-channel MOS transistors P1, P2, ... of FIGS. 6, 7 and 8 are replaced by N-channel MOS transistors N1', N2', ..., respectively. Also, the current sources I1, I2, I11 and I12 and the capacitor C1 of FIGS. 6, 7 and 8 are replaced by current sources I1', I2', I11' and I12' and a capacitor C1', respectively.

The operations of the circuits of FIGS. 9, 10, 11 and 12 are the same those of FIGS. 4, 6, 7 and 8, respectively.

Also, in FIGS. 4, 6, 7, 8, 9, 10, 11 and 12, each of the N-channel MOS transistors can be replaced by an NPN-type bipolar transistor, and each of the P-channel MOS transistors can be replaced by a PNP-type bipolar transistor.

Figure 13:
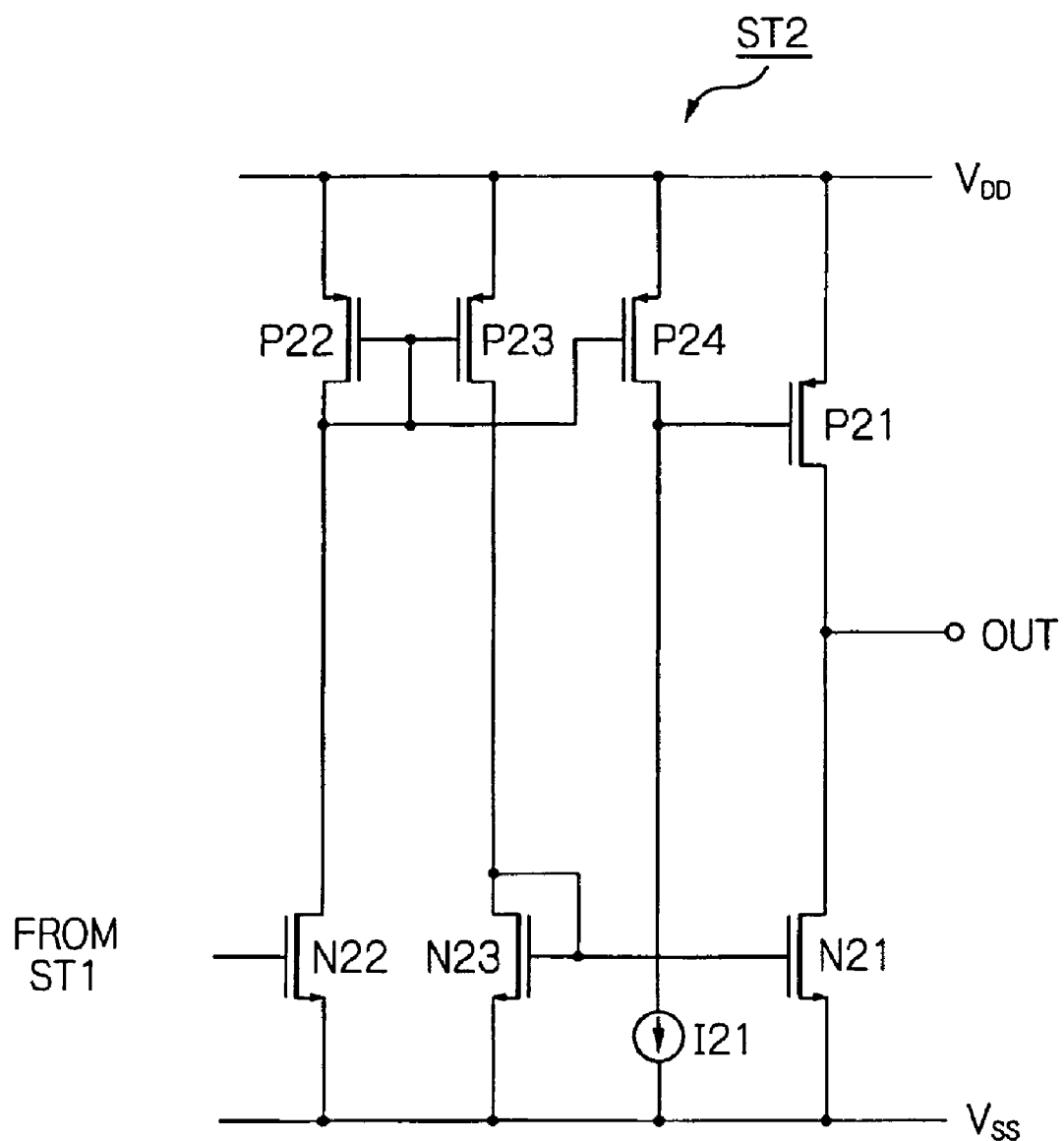
FIG. 13 is a circuit diagram of a modification of the output stage of the circuits of FIGS. 4, 6, 7 and 8.

Further, in FIGS. 4, 6, 7 and 8, other single-end push-pull circuits can be applied to the output stage ST2. For example, as illustrated in FIG. 13, the output stage ST2 is constructed by a single-end push-pull circuit formed by a P-channel MOS transistor P21 and an N-channel MOS transistor N21 connected in series between the high potential side power supply line $V_{DD}$ and the low potential side power supply line $V_{SS}$. Also, P-channel MOS transistors P22, P23 and P24, N-channel MOS transistors N22 and N23, and a current source I21 are provided. In this case, the P-channel MOS transistor P22 and the N-channel MOS transistor N22 form an inverter, the P-channel MOS transistor P23 and the N-channel MOS transistor N23 form an inverter, and the P-channel MOS transistor P24 and the current source I21 form an inverter. Therefore, the output voltage of the input stage ST1 is supplied via the inverter (P22, N22) and the inverter (P23, N23) to the gate of the N-channel MOS transistor N21, while the output voltage of the input stage ST1 is supplied via the inverter (P22, N22) and the inverter (P24, I21) to the gate of the P-channel MOS transistor P21.

Figure 14:
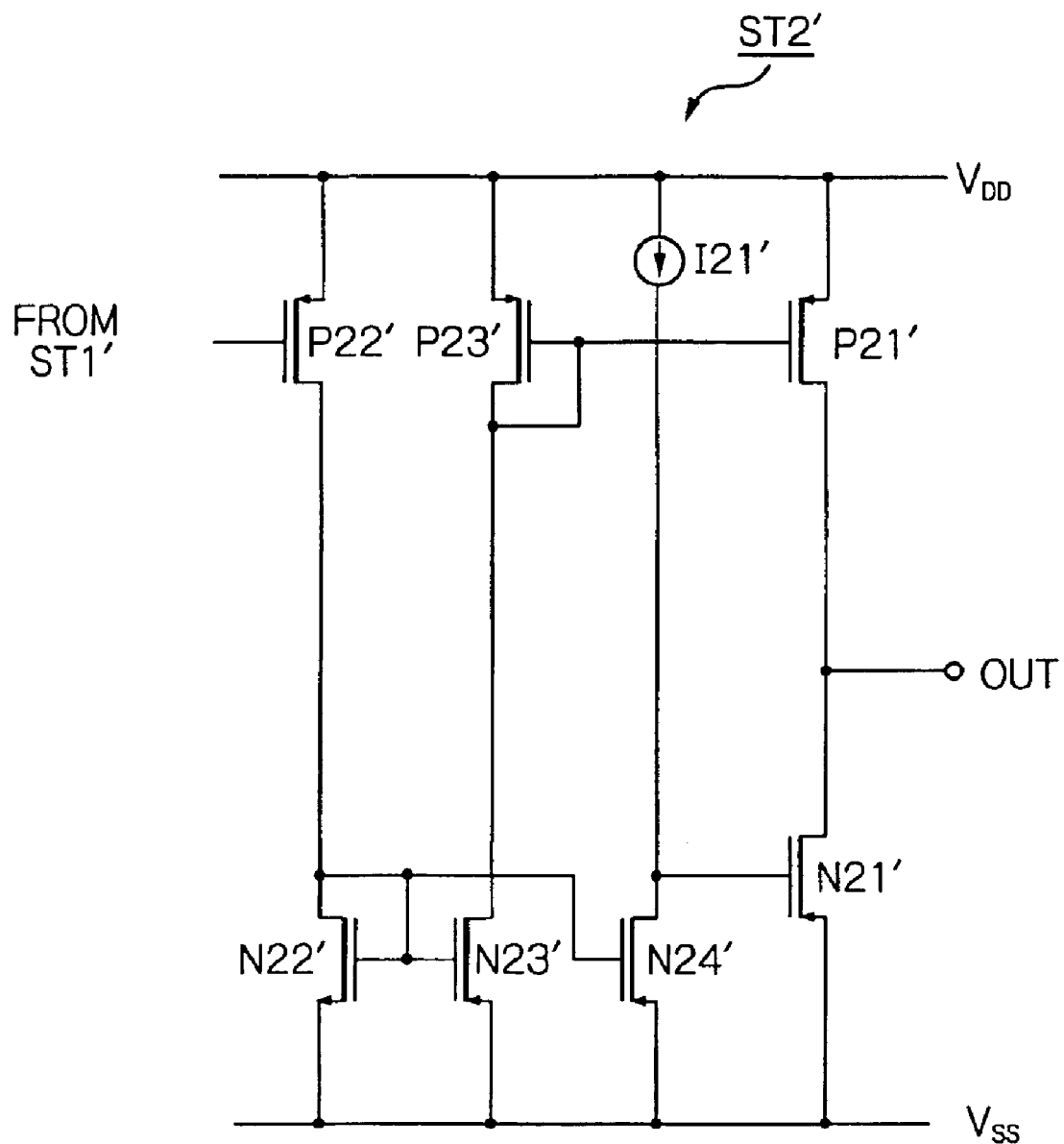
FIG. 14 is a circuit diagram of a modification of the output stage of the circuits of FIGS. 9, 10, 11 and 12.

On the other hand, in FIGS. 9, 10, 11 and 12, other single-end push-pull circuits can also be applied to the output stage ST2'. For example, as illustrated in FIG. 14, the output stage ST2' is constructed by a single-end push-pull circuit formed by a P-channel MOS transistor P21' and an N-channel MOS transistor N21' connected in series between the high potential side power supply line $V_{DD}$ and the low potential side power supply line $V_{SS}$. Also, P-channel MOS transistors P22' and P23', N-channel MOS transistors N22', N23' and N24', and a current source I21' are provided. In this case, the P-channel MOS transistor P22' and the N-channel MOS transistor N22' form an inverter, the P-channel MOS transistor P23' and the N-channel MOS transistor N23' form an inverter, and the P-channel MOS transistor P24' and the current source I21' form an inverter. Therefore, the output voltage of the input stage ST1' is supplied via the inverter (P22', N22') and the inverter (I21', N24') to the gate of the N-channel MOS transistor N21', while the output voltage of the input stage ST1' is supplied via the inverter (P22', N22') and the inverter (P23', N23') to the gate of the P-channel MOS transistor P21'.

As explained hereinabove, according to the present invention, in a transient state, since the driving ability is enhanced by increasing only load currents without increasing bias currents to rapidly converge the transient state to a steady state, the power consumption can be decreased.

What is claimed is:

1. A driver comprising:
    a voltage-follower-type operational amplifier for receiving current input data to generate an output signal;
    a transient state detecting circuit for detecting a transient state in said current input data to generate a first pulse signal when said current input data is increased and generate a second pulse signal when said current input data is decreased; and
    a switch circuit, connected between said transient state detecting circuit and said voltage-follower-type operational amplifier, for substantially increasing corresponding load currents flowing through said voltage-follower-type operational amplifier in accordance with said first and second pulse signals.

2. The driver as set forth in claim 1, wherein said transient state detecting circuit comprises:
    a data register circuit for storing a previous input data of said current input data;
    a comparator, connected to said data register circuit, for comparing said current input data with said previous input data;
    a first pulse signal generating circuit, connected to said comparator, for generating said first pulse signal when said current input data becomes larger than said previous input data; and
    a second pulse signal generating circuit, connected to said comparator, for generating said second pulse signal when said current input data becomes smaller than said previous input data.

3. The driver as set forth in claim 2, wherein said first pulse generating circuit comprises a one-shot triggered by a rising edge of an output signal of said comparator, and said second pulse generating circuit comprises a one-shot triggered by a falling edge of the output signal of said comparator.

4. The driver as set forth in claim 2, wherein said switch circuit comprises:
    a first switch, connected to said first pulse generating circuit and being turned ON by said first pulse signal; and
    a second switch, connected to said second pulse generating circuit and being turned ON by said second pulse signal.

5. The driver as set forth in claim 4, wherein each of said first and second switches comprises a MOS transistor.

6. The driver as set forth in claim 4, wherein each of said first and second switches comprises a bipolar transistor.

7. The driver as set forth in claim 1, wherein said voltage-follower-type operational amplifier comprises:
    first and second power supply lines;
    first and second current sources connected to said second and first power supply lines, respectively;
    a first differential pair of a first conductivity type, connected to said first current source, for differentially amplifying said current input data and said output signal;

a second differential pair of a second conductivity type, connected to said second current source, for differentially amplifying said output signal and said current input data;

a first current mirror circuit of said second conductivity type connected to said first power supply line and having an input connected to an inverting-output of said first differential pair and an output connected to a non-inverting output of said second differential pair;

a second current mirror circuit of said second conductivity type connected to said first power supply line and having an input connected to a non-inverting-output of said first differential pair and an output connected to an inverting output of said second differential pair;

a third current mirror circuit of said first conductivity type connected to said second power supply line and having an input connected to a non-inverting-output of said second differential pair and an output connected to an inverting output of said second differential pair; and a single-end push-pull circuit, connected between said first and second power supply lines, for receiving a voltage at the output of said third current mirror circuit to generate said output signal, load currents flowing through said third current mirror circuit substantially increasing in accordance with said first and second pulse signals.

8. The driver as set forth in claim 4, wherein said voltage-follower-type operational amplifier comprises:

first and second power supply lines;

first and second current sources connected to said second and first power supply lines, respectively;

a first differential pair of a first conductivity type, connected to said first current source, for differentially amplifying said current input data and said output signal;

a second differential pair of a second conductivity type, connected to said second current source, for differentially amplifying said output signal and said current input data;

a first current mirror circuit of said second conductivity type connected to said first power supply line and having an input connected to an inverting-output of said first differential pair and an output connected to a non-inverting output of said second differential pair;

a second current mirror circuit of said second conductivity type connected to said first power supply line and having an input connected to a non-inverting-output of said first differential pair and an output connected to an inverting output of said second differential pair;

a third current mirror circuit of said first conductivity type connected to said second power supply line and having an input connected to a non-inverting-output of said second differential pair and an output connected to an inverting output of said second differential pair; and a single-end push-pull circuit, connected between said first and second power supply lines, for receiving a voltage at the output of said third current mirror circuit to generate said output signal, said first switch being connected between said first power supply line and the output of said first current mirror circuit, said second switch being connected between said first power supply line and the output of said second current mirror circuit.

9. The driver as set forth in claim 4, wherein said voltage-follower-type operational amplifier comprises:

first and second power supply lines;

first and second current sources connected to said second and first power supply lines, respectively;

a first differential pair of a first conductivity type, connected to said first current source, for differentially amplifying said current input data and said output signal;

a second differential pair of a second conductivity type, connected to said second current source, for differentially amplifying said output signal and said current input data;

a first current mirror circuit of said second conductivity type connected to said first power supply line and having an input connected to an inverting-output of said first differential pair and an output connected to a non-inverting output of said second differential pair;

a second current mirror circuit of said second conductivity type connected to said first power supply line and having an input connected to a non-inverting-output of said first differential pair and an output connected to an inverting output of said second differential pair;

a third current mirror circuit of said first conductivity type connected to said second power supply line and having an input connected to a non-inverting-output of said second differential pair and an output connected to an inverting output of said second differential pair; and a single-end push-pull circuit, connected between said first and second power supply lines, for receiving a voltage at the output of said third current mirror circuit to generate said output signal, said first switch being connected between said second power supply line and the output of said third current mirror circuit, said second switch being connected between said first power supply line and the output of said second current mirror circuit.

10. The driver as set forth in claim 4, wherein said voltage-follower-type operational amplifier comprises:

first and second power supply lines;

first and second current sources connected to said second and first power supply lines, respectively;

a first differential pair of a first conductivity type, connected to said first current source, for differentially amplifying said current input data and said output signal;

a second differential pair of a second conductivity type, connected to said second current source, for differentially amplifying said output signal and said current input data;

a first current mirror circuit of said second conductivity type connected to said first power supply line and having an input connected to an inverting-output of said first differential pair and an output connected to a non-inverting output of said second differential pair;

a second current mirror circuit of said second conductivity type connected to said first power supply line and having an input connected to a non-inverting-output of said first differential pair and an output connected to an inverting output of said second differential pair;

a third current mirror circuit of said first conductivity type connected to said second power supply line and having an input connected to a non-inverting-output of said second differential pair and an output connected to an inverting output of said second differential pair; and a single-end push-pull circuit, connected between said first and second power supply lines, for receiving a voltage at the output of said third current mirror circuit to generate said output signal, said first switch being connected between said second power supply line and the output of said third current mirror circuit, said second switch being connected between said second power supply line and the input of said third current mirror circuit.

11. The driver as set forth in claim 4, wherein said voltage-follower-type operational amplifier comprises:

first and second power supply lines;

first and second current sources connected to said second and first power supply lines, respectively;

a first differential pair of a first conductivity type, connected to said first current source, for differentially amplifying said current input data and said output signal;

a second differential pair of a second conductivity type, connected to said second current source, for differentially amplifying said output signal and said current input data;

a first current mirror circuit of said second conductivity type connected to said first power supply line and having an input connected to an inverting-output of said first differential pair and an output connected to a non-inverting output of said second differential pair;

a second current mirror circuit of said second conductivity type connected to said first power supply line and having an input connected to a non-inverting-output of said first differential pair and an output connected to an inverting output of said second differential pair;

a third current mirror circuit of said first conductivity type connected to said second power supply line and having an input connected to a non-inverting-output of said second differential pair and an output connected to an inverting output of said second differential pair; and a single-end push-pull circuit, connected between said first and second power supply lines, for receiving a voltage at the output of said third current mirror circuit to generate said output signal, said first switch being connected between said first power supply line and the output of said first current mirror circuit, said second switch being connected between said second power supply line and the input of said third current mirror circuit.

12. A data line driver circuit for driving a plurality of data lines in a display apparatus comprising:

a shift register circuit for generating latch signals;

a plurality of data register circuits, connected to said shift register circuit, each for latching current input data in synchronization with a respective one of said latch signals;

a plurality of digital/analog converters, each connected to one of said data register circuits, for performing digital/analog conversions upon said current input data; and a plurality of drivers for receiving analog output voltages from said digital/analog converters to generate output signals for said data lines, each of said drivers comprising:

a voltage-follower-type operational amplifier, connected to one of said digital/analog converters, for receiving one of said analog output voltages to generate one of said output signals;

a transient state detecting circuit, connected to said shift register circuit and one of said data register circuits for detecting a transient state in a respective one of said current input data to generate a first pulse signal when the respective one of said current input data is increased and generate a second pulse signal when the respective one of said current input data is decreased; and a switch circuit, connected between said transient state detecting circuit and said voltage-follower-type operational amplifier, for substantially increasing corresponding load currents flowing through said voltage-follower-type operational amplifier in accordance with said first and second pulse signals.

13. The data line driver circuit as set forth in claim 12, wherein said transient state detecting circuit comprises:

an additional data register circuit, connected to a respective one of said data register circuit, for latching a previous input data of the respective one of said current input data in synchronization with a respective one of said latch;

a comparator, connected to the respective one of said data register circuit and said additional data register circuit, for comparing said current input data with said previous input data;

a first pulse signal generating circuit, connected to said comparator, for generating said first pulse signal when said current input data becomes larger than said previous input data; and a second pulse signal generating circuit, connected to said comparator, for generating said second pulse signal when said current input data becomes smaller than said previous input data.

14. The data line driver circuit as set forth in claim 13, wherein said first pulse generating circuit comprises a one-shot triggered by a rising edge of an output signal of said comparator, and said second pulse generating circuit comprises a one-shot triggered by a falling edge of the output signal of said comparator.

15. The data line driver circuit as set forth in claim 13, wherein said switch circuit comprises:

a first switch, connected to said first pulse generating circuit and being turned ON by said first pulse signal; and a second switch, connected to said second pulse generating circuit and being turned ON by said second pulse signal.

16. The data line driver circuit as set forth in claim 15, wherein each of said first and second switches comprises a MOS transistor.

17. The data line driver circuit as set forth in claim 15, wherein each of said first and second switches comprises a bipolar transistor.

18. The data line driver circuit as set forth in claim 15, wherein said voltage-follower-type operational amplifier comprises:

first and second power supply lines;

first and second current sources connected to said second and first power supply lines, respectively;

a first differential pair of a first conductivity type, connected to said first current source, for differentially amplifying said current input data and said output signal;

a second differential pair of a second conductivity type, connected to said second current source, for differentially amplifying said output signal and said current input data;

a first current mirror circuit of said second conductivity type connected to said first power supply line and having an input connected to an inverting-output of said first differential pair and an output connected to a non-inverting output of said second differential pair;

a second current mirror circuit of said second conductivity type connected to said first power supply line and having an input connected to a non-inverting-output of said first differential pair and an output connected to an inverting output of said second differential pair;

a third current mirror circuit of said first conductivity type connected to said second power supply line and having an input connected to a non-inverting-output of said second differential pair and an output connected to an inverting output of said second differential pair; and a single-end push-pull circuit, connected between said first and second power supply lines, for receiving a voltage at the output of said third current mirror circuit to generate said output signal, load currents flowing through said third current mirror circuit substantially increasing in accordance with said first and second pulse signals.

19. The data line driver circuit as set forth in claim 15, wherein said voltage-follower-type operational amplifier comprises:

first and second power supply lines;

first and second current sources connected to said second and first power supply lines, respectively;

a first differential pair of a first conductivity type, connected to said first current source, for differentially amplifying said current input data and said output signal;

a second differential pair of a second conductivity type, connected to said second current source, for differentially amplifying said output signal and said current input data;

a first current mirror circuit of said second conductivity type connected to said first power supply line and having an input connected to an inverting-output of said first differential pair and an output connected to a non-inverting output of said second differential pair;

a second current mirror circuit of said second conductivity type connected to said first power supply line and having an input connected to a non-inverting-output of said first differential pair and an output connected to an inverting output of said second differential pair;

a third current mirror circuit of said first conductivity type connected to said second power supply line and having an input connected to a non-inverting-output of said second differential pair and an output connected to an inverting output of said second differential pair; and a single-end push-pull circuit, connected between said first and second power supply lines, for receiving a voltage at the output of said third current mirror circuit to generate said output signal, said first switch being connected between said first power supply line and the output of said first current mirror circuit, said second switch being connected between said first power supply line and the output of said second current mirror circuit.

20. The data line driver circuit as set forth in claim 15, wherein said voltage-follower-type operational amplifier comprises:

first and second power supply lines;

first and second current sources connected to said second and first power supply lines, respectively;

a first differential pair of a first conductivity type, connected to said first current source, for differentially amplifying said current input data and said output signal;

a second differential pair of a second conductivity type, connected to said second current source, for differentially amplifying said output signal and said current input data;

a first current mirror circuit of said second conductivity type connected to said first power supply line and having an input connected to an inverting-output of said first differential pair and an output connected to a non-inverting output of said second differential pair;

a second current mirror circuit of said second conductivity type connected to said first power supply line and having an input connected to a non-inverting-output of said first differential pair and an output connected to an inverting output of said second differential pair;

a third current mirror circuit of said first conductivity type connected to said second power supply line and having an input connected to a non-inverting-output of said second differential pair and an output connected to an inverting output of said second differential pair; and a single-end push-pull circuit, connected between said first and second power supply lines, for receiving a voltage at the output of said third current mirror circuit to generate said output signal, said first switch being connected between said second power supply line and the output of said third current mirror circuit, said second switch being connected between said first power supply line and the output of said second current mirror circuit.

21. The data line driver circuit as set forth in claim 15, wherein said voltage-follower-type operational amplifier comprises:

first and second power supply lines;

first and second current sources connected to said second and first power supply lines, respectively;

a first differential pair of a first conductivity type, connected to said first current source, for differentially amplifying said current input data and said output signal;

a second differential pair of a second conductivity type, connected to said second current source, for differentially amplifying said output signal and said current input data;

a first current mirror circuit of said second conductivity type connected to said first power supply line and having an input connected to an inverting-output of said first differential pair and an output connected to a non-inverting output of said second differential pair;

a second current mirror circuit of said second conductivity type connected to said first power supply line and having an input connected to a non-inverting-output of said first differential pair and an output connected to an inverting output of said second differential pair;

a third current mirror circuit of said first conductivity type connected to said second power supply line and having an input connected to a non-inverting-output of said second differential pair and an output connected to an inverting output of said second differential pair; and a single-end push-pull circuit, connected between said first and second power supply lines, for receiving a voltage at the output of said third current mirror circuit to generate said output signal, said first switch being connected between said second power supply line and the output of said third current mirror circuit, said second switch being connected between said second power supply line and the input of said third current mirror circuit.

22. The data line driver circuit as set forth in claim 15, wherein said voltage-follower-type operational amplifier comprises:

first and second power supply lines;

first and second current sources connected to said second and first power supply lines, respectively;

a first differential pair of a first conductivity type, connected to said first current source, for differentially amplifying said current input data and said output signal;

a second differential pair of a second conductivity type, connected to said second current source, for differentially amplifying said output signal and said current input data;

a first current mirror circuit of said second conductivity type connected to said first power supply line and having an input connected to an inverting-output of said first differential pair and an output connected to a non-inverting output of said second differential pair;

a second current mirror circuit of said second conductivity type connected to said first power supply line and having an input connected to a non-inverting-output of said first differential pair and an output connected to an inverting output of said second differential pair;

a third current mirror circuit of said first conductivity type connected to said second power supply line and having an input connected to a non-inverting-output of said second differential pair and an output connected to an inverting output of said second differential pair; and a single-end push-pull circuit, connected between said first and second power supply lines, for receiving a voltage at the output of said third current mirror circuit to generate said output signal, said first switch being connected between said first power supply line and the output of said first current mirror circuit, said second switch being connected between said second power supply line and the input of said third current mirror circuit.

* * * * *